United States Patent [19]

Mase

[11] Patent Number: 4,934,045

[45] Date of Patent: Jun. 19, 1990

[54] METHOD OF PRODUCING ELECTRIC CIRCUIT PATTERNS

[75] Inventor: Akira Mase, Atsugi, Japan

[73] Assignee: Semiconductor Energy Laboratory Co., Ltd., Kanagawa, Japan

[21] Appl. No.: 303,241

[22] Filed: Jan. 30, 1989

[30] Foreign Application Priority Data

| Feb. 5, 1988 | [JP] | Japan | 63-025911 |
| Feb. 5, 1988 | [JP] | Japan | 63-25912 |
| Feb. 5, 1988 | [JP] | Japan | 63-25913 |
| Feb. 5, 1988 | [JP] | Japan | 63-25914 |
| Feb. 5, 1988 | [JP] | Japan | 63-25915 |
| Feb. 5, 1988 | [JP] | Japan | 63-25916 |

[51] Int. Cl.$^5$ .............................. H01R 43/00
[52] U.S. Cl. ........................ 29/854; 29/846; 174/260
[58] Field of Search .................. 29/857, 854; 174/117 FF, 68.5

[56] References Cited

U.S. PATENT DOCUMENTS

| 3,499,098 | 3/1970 | McGahey et al. | 174/68.5 |
| 3,644,661 | 2/1972 | Asar et al. | 174/68.5 |
| 4,252,991 | 2/1981 | Iwabushi | 174/68.5 |
| 4,268,956 | 5/1981 | Parks et al. | 29/846 X |
| 4,417,096 | 11/1983 | Willette | 174/117 FF X |
| 4,580,193 | 4/1986 | Edwards | 174/68.5 X |

Primary Examiner—Carl J. Arbes
Attorney, Agent, or Firm—Sixbey, Friedman, Leedom & Ferguson

[57] ABSTRACT

A method of producing patterns consisting of buslines and two or more sets of lead lines. The lead lines are formed together with fragments of the buslines. Portions of the lead lines are coated with insulating films. The fragments of the buslines are coupled by forming compensatory buslines in alignment therewith.

7 Claims, 7 Drawing Sheets

METHOD OF PRODUCING ELECTRIC CIRCUIT PATTERNS

BACKGROUND OF THE INVENTION

The present invention relates to a method of producing electric circuit patterns.

Printed boards have been broadly used for carrying electric circuit patterns, on which are mounted, in electric contact therewith, electric devices such as IC chips, transistors, resistances, capacitances, inductances and so forth. For example, in case of the driving circuits of liquid crystal devices, IC chips are mounted on a printed board and electrically connected at their terminals (pins or contacts) with a number of addressing lines formed on the printed board. However, since a number of IC chips or other electric devices are connected with same electrode lines, the connection condition and the device performance of a respective device connected to common lines can not be tested independently.

An example of the connection of a prior art pattern with a device is schematically illustrated in FIGS. 1(A) to 1(C). A number of parallel buslines 15 are formed on a printed circuit board 1 by wet etching as shown in FIG. 1(A). A certain surface portion of the board is converted with an insulating film 4 over the buslines 15. In the insulating film 4, a number of apertures are opened in order to provide accesses to the buslines 15 as seen from FIG. 1(B). Furthermore, a number of local electrode lead lines 17 are formed in order to make electric contact with the buslines 15 independently through the respective apertures. One or several devices can be electrically connected with the buslines 15 through the lead lines 17. This type of connection may be made in the same manner along the buslines 15. There are two problems in this prior art. One is disconnection between the lines 15 and 17 which may occur due to misalignment of the lines 15 and 17 and the apertures 16. This is likely particularly when the number of buslines to be coupled is increased. The other problem is the impossibility of independently testing of the connection between the device and the lines 15 and the test of the device performance as already pointed out supra.

SUMMARY OF THE INVENTION

It is an object of the present invention to provide a method of producing electric circuit patterns in which a plurality of buslines, each consisting of a number of electrode parallel strips, can be connected to lead lines without disconnection.

It is another object of the present invention to provide a method of producing electric circuit patterns, which allows independent check of the circuit performance with respect to independent electric devices and disconnection of the circuit pattern.

It is a further object of the present invention to provide a method of producing electric circuit patterns at a low cost basis.

DETAILED DESCRIPTION OF THE PREFERRED EMBODIMENTS

Figure 2A:
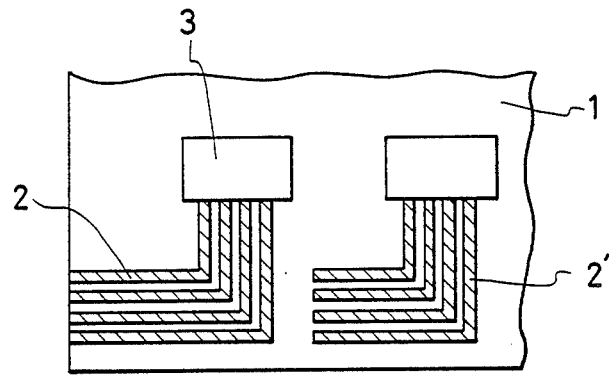
FIGS. 2(A) to 2(C) are plan views showing a method of producing an electric pattern in accordance with the present invention.
Figure 2B:
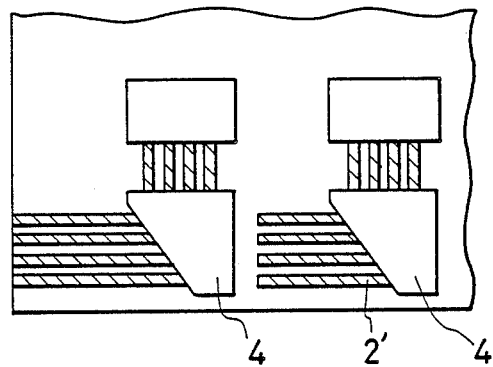
Figure 2C:
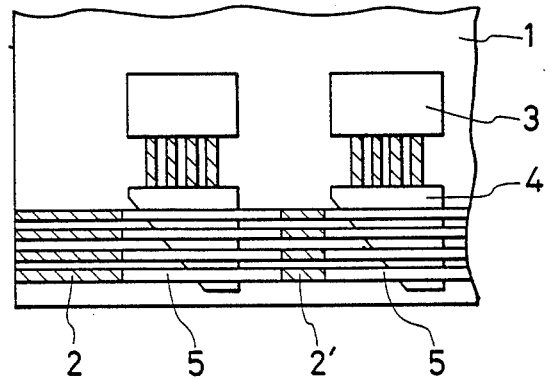

Referring now to FIGS. 2(A) to 2(C), a method of producing an electric circuit pattern is explained in accordance with the present invention. In place of forming buslines of continuous parallel electrode strips, local "L" shaped patterns 2 and 2' including lead lines for connection of respective electric devices are formed integrally with fragments of buslines (extending in the lateral direction). With this configuration, the connection between the buslines (only fragments at this stage) and the lead lines has been established. Needless to say, more similar patterns are formed in the same manner along the buslines although not described in the figure. Numeral 3 indicates a necessary pattern required for actual connection of the respective device. After mounting the electric devices such as IC chips on the respective patterns, the connection and performance of the devices are checked and, if defective devices or incomplete connection are founded, the devices are replaced by new devices or connected again to make complete connection, followed by the re-check.

Figure 1A:
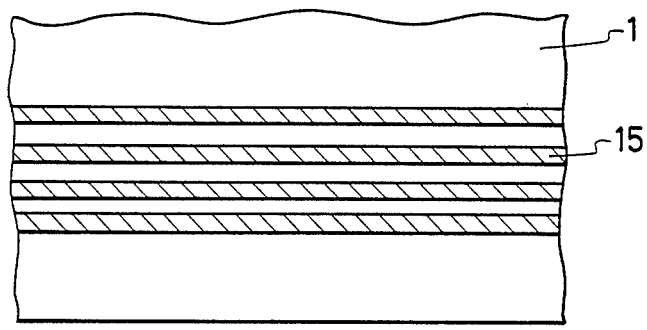
FIGS. 1(A) to 1(C) are plan views showing a prior art method of producing an electric pattern.
Figure 1B:
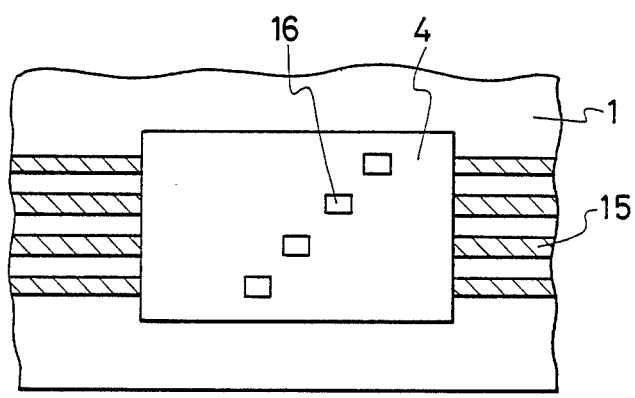
Figure 1C:
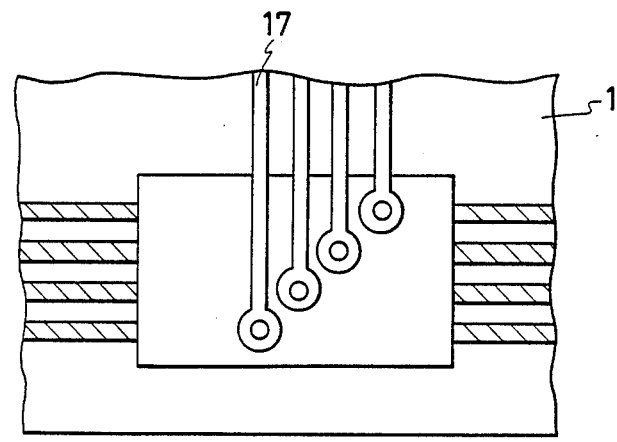

The curved portions of the pattern 2 and 2' are covered with an insulating films 4 as shown in FIG. 2(B). Then, the fragmental buslines (the laterally extending portions of the patterns) are continuously connected by forming parallel electrode strips in alignment with the fragments over and beyond the insulating films 4 as shown in FIG. 1(C).

Figure 3A:
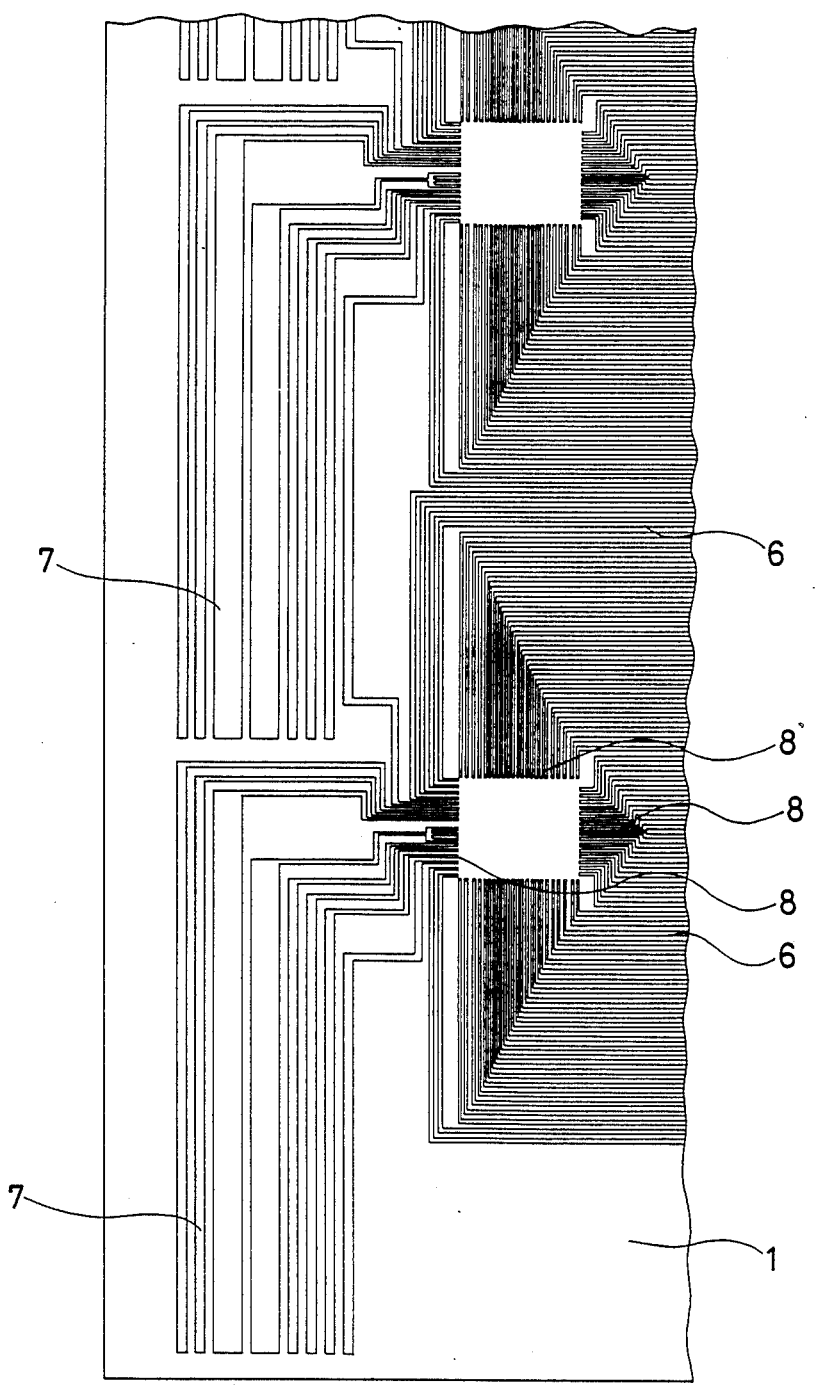
FIGS. 3(A) to 3(D) are plan views showing a method of producing an electric pattern required for driving a liquid crystal device in accordance with the present invention.
Figure 3B:
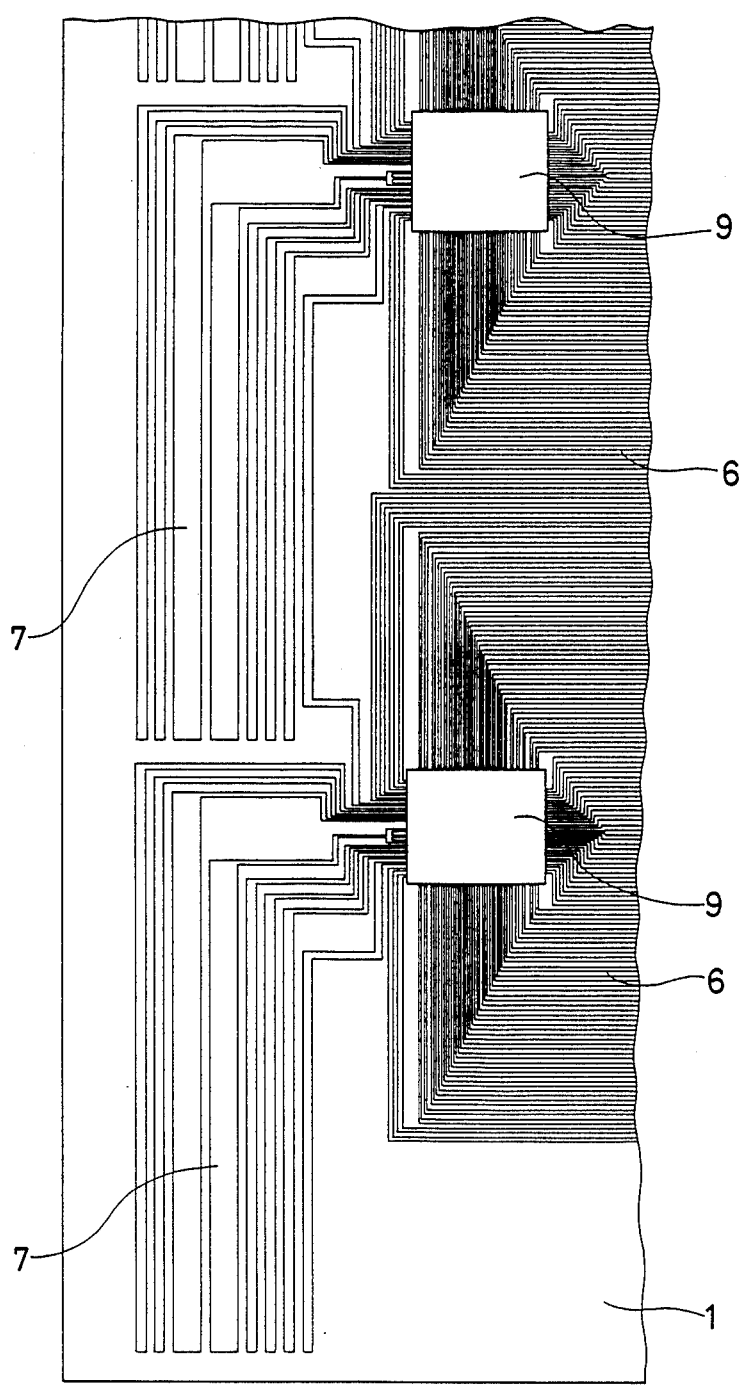

Referring next to FIGS. 3(A) to 3(D), fabrication method of a liquid crystal driving circuit is described. Patterns are formed from an ITO film on a glass substrate 1 by wet etching. The glass substrate 1 is provided with a highly flat surface in accordance with a general requirement of driving circuits for liquid crystal device manufacture. The patterns includes a plurality of "L" shaped patterns 7 consisting of lead lines and the fragmented buslines, and an addressing patterns provided for each "L" shaped pattern and consisting of a number of parallel strips 6. The strips 6 are extending to the right in order to form addressing strips. The "L" shaped lines 7 and the lines 6 terminate in order to define IC chip mounting places as illustrated in FIG. 3(A). In this condition, IC chips 9 are mounted on the IC chip mounting places and connected to the ends of the lines and the strips by face down bonding as illustrated in FIG. 3(B). The mounting of the IC chips is carried out by disposing a UV light curable adhesive between the mounting place and the rear surface of the IC chips. The adhesive is cured under a pressure of 3 Kg by exposing it to UV light of 365 nm at 150° C. for 3 minutes. The "L" shaped patterns are provided independently for the respective chips, and therefore the connection and the performace of the IC chips can be checked independently. If the check indicates some trouble, the IC chip is removed and the mounting step is repeated, if necessary, with a substitute chip.

Figure 3C:
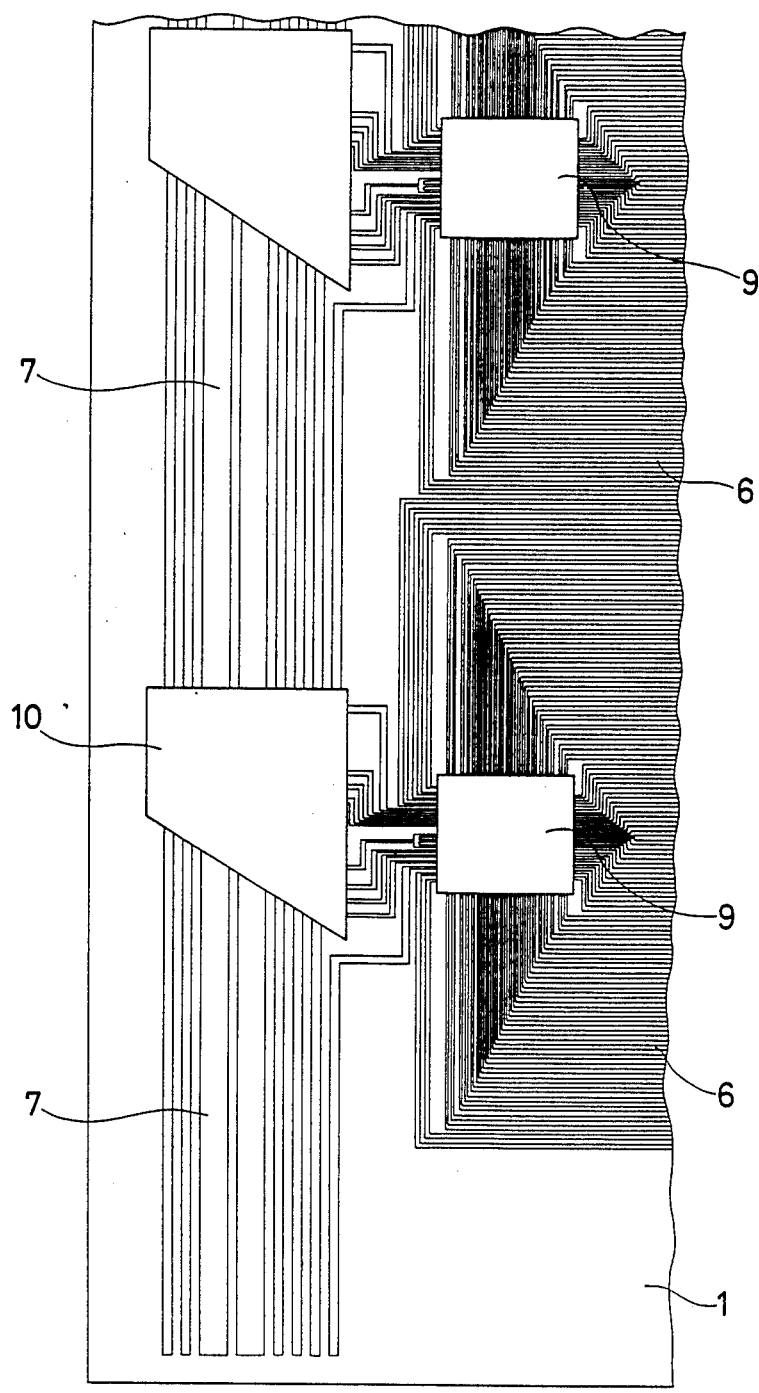
Figure 3D:
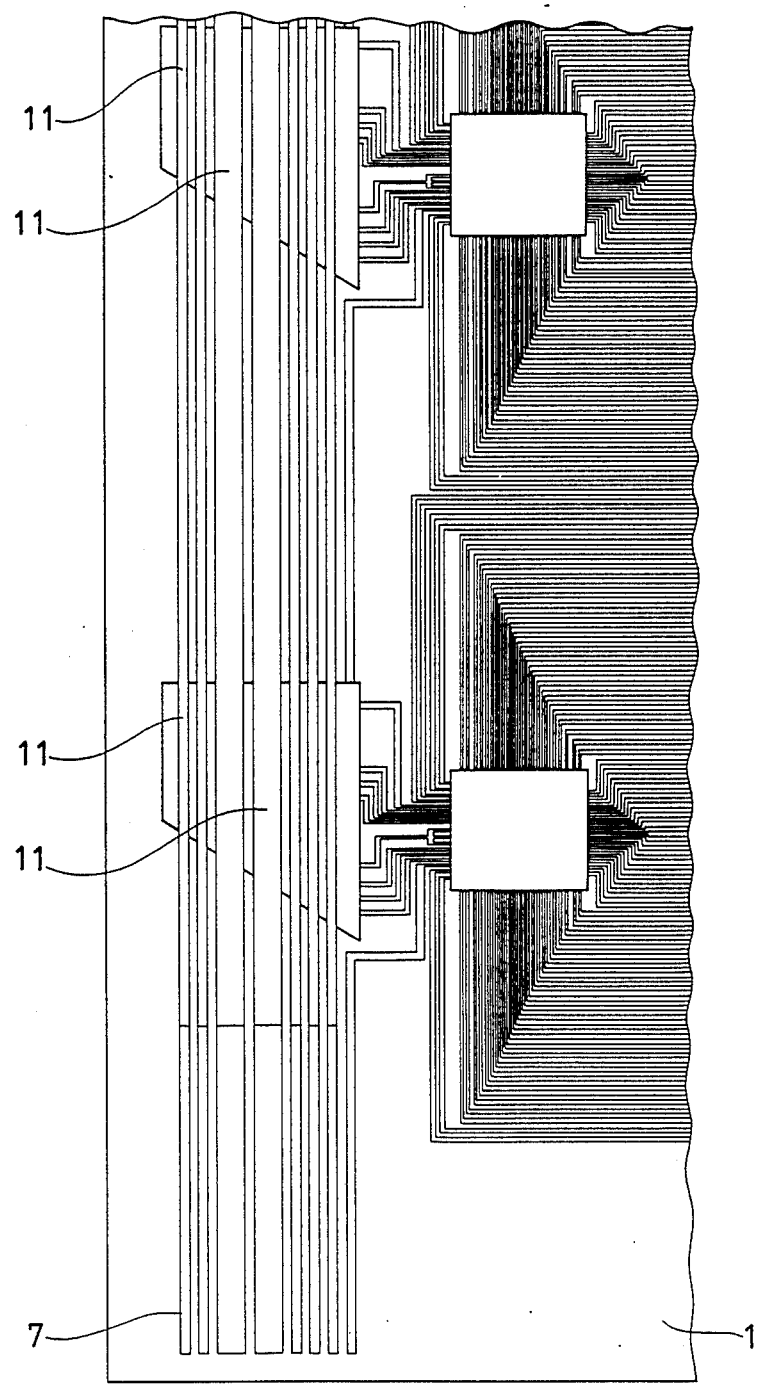

After the checking of the electrical performance, the curved portions of the patterns are covered with insulating films 10 of 40 to 50 microns thickness as illustrated in FIG. 3(C). The insulating films are formed from epoxy resin by screen press printing and thermal annealed at 180° C. for 30 minutes. The checking of the IC chip connection and performance may be done at this stage.

Finally, the fragmented buslines 7 are coupled by forming parallel electrode 11 in alignment with the buslines 7 over the insulating films 10. The lines 11 are formed of a copper paste by screen press printing and thermal annealed at 180° C. for 20 minutes. The patterns thus completed are covered with a protective film.

Another glass substrate is provided with patterns in the same manner. The patterns include Y-electrodes which form a matrix electrode arrangement with the X-electrodes, when the two glass substrates are joined with spacers therebetween. The periphery of the joined substrates are sealled off by a sealing member. The manufacture of the liquid crystal device is completed by disposing a liquid crystal material between the substrates.

The abovementioned method may be employed in the same manner for producing an image sensor. In this case, the strips 6 will respectively terminate in electrodes of a photosensitive semiconductor device where the photosensitive device may comprise an amorphous silicon semiconductor film formed on the above electrodes and a common opposed electrode formed on the semiconductor film. Of course, the IC chip 9 should be selected suitable to drive the image sensor. Particularly, thermal annealing used in the method should be carried out at a low temperature, e.g. not higher than 200° C., in order not to damage the semiconductor film.

The present invention can be broadly applied to production methods of general electric devices. In the semiconductor field, it is frequently required to withdraw signals from buslines in order to supply the signals from the bus lines to semiconductor devices and vice versa, and therefore there can be expected profitable effects in accordance with the present invention.

While several embodiments have been specifically described, it is to be appreciated that the present invention is not limited to the particular examples described and that modifications and variations can be made without departure from the scope of the invention as defined by the appended claims.

Figure 4A:
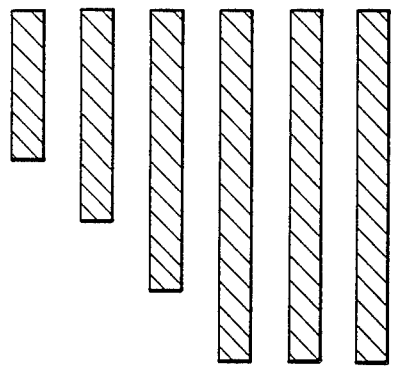
FIGS. 4(A) to 4(C) are schematic diagrams showing several patterns of insulating films in accordance with the present invention.
Figure 4B:
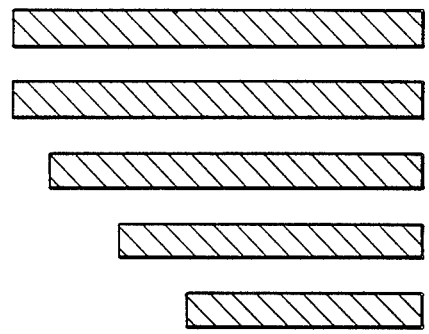
Figure 4C:
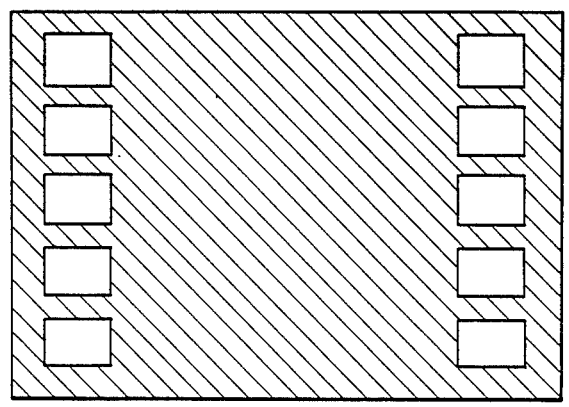

The pattern of the insulating film to insulate the connection between the fragmented buslines and the lead lines may be designed as illustrated in FIGS. 4(A) to 4(C) or other suitable forms.

The strips 6 can be formed by laser patterning utilizing an excimer laser as described in Japanese Patent Application No. sho61-86202. In this case, the patterns 7 may be produced by press printing as the pattern 11.

I claim:

1. A method of producing electric circuit patterns consisting of a plurality of buslines and two or more sets of lead lines, the lead lines of each set being coupled to said buslines respectively, said method comprising:

forming two or more preceding patterns, each consisting of the lead lines of one of said sets and fragments of said buslines which have been already coupled, wherein the fragments belonging to each preceding pattern are spaced from those of the adjacent preceding patterns;

coating an insulating film over portions of said preceding patterns of said sets that are located at sites on which said buslines are to be formed;

electrically coupling the fragmented buslines of adjacent preceding patterns by coating compensatory buslines in alignment with the fragmented buslines over said insulating films; and connecting an electric device to each set of lead lines in advance of the electrical coupling step of said fragmented buslines.

2. The method of claim 1 wherein said preceding patterns consist of a plurality of "L" shaped conductive lines.

3. The method of claim 1 wherein said electric circuit pattern is designed for driving circuits of liquid crystal device.

4. The method of claim 1 wherein said electric circuit pattern is designed for driving circuits of image sensor.

5. The method of claim 1 further comprising a step of checking the electrical connection and performance of said device connected to said lead lines in advance of the coupling step.

6. The method of claim 1 wherein said electric device is connected to each set of lead lines in advance of the coating step of the insulating film.

7. The method of claim 1 wherein said electric device is connected to each set of lead lines after the coating step of the insulating film.

* * * * *